United States Patent
Lee

(10) Patent No.: US 9,565,774 B2
(45) Date of Patent: Feb. 7, 2017

(54) EMBEDDED TRACE SUBSTRATE AND METHOD OF FORMING THE SAME

(71) Applicant: Amkor Technology, Inc., Tempe, AZ (US)

(72) Inventor: Ah Ron Lee, Seoul (KR)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/602,233

(22) Filed: Jan. 21, 2015

(65) Prior Publication Data

US 2015/0208517 A1 Jul. 23, 2015

(30) Foreign Application Priority Data

Jan. 22, 2014 (KR) .................. 10-2014-0007915

(51) Int. Cl.
| | |
|---|---|
| H05K 1/09 | (2006.01) |
| H05K 3/40 | (2006.01) |
| H05K 3/00 | (2006.01) |
| H05K 3/06 | (2006.01) |
| H05K 1/11 | (2006.01) |

(52) U.S. Cl.
CPC ............ H05K 3/4007 (2013.01); H05K 3/007 (2013.01); H05K 1/115 (2013.01); H05K 3/064 (2013.01)

(58) Field of Classification Search
CPC .............. H05K 1/09; H05K 1/11; H05K 1/16; H05K 1/18; H05K 3/00; H05K 3/02; H05K 3/10; H05K 3/20; H05K 3/22; H05K 3/40; H01L 21/02; H01L 21/48; H01L 21/58; H01L 21/70; H01L 23/00; H01L 23/36; H01L 23/48

USPC 174/251, 255, 257, 261, 262, 266; 361/783; 430/314; 257/415, 717, 685, 750
See application file for complete search history.

(56) References Cited

U.S. PATENT DOCUMENTS

| | | | | |
|---|---|---|---|---|
| 5,146,674 | A * | 9/1992 | Frankeny | H01L 21/4857 257/E23.173 |
| 5,239,448 | A * | 8/1993 | Perkins | H01L 23/5385 174/266 |
| 5,610,431 | A * | 3/1997 | Martin | G01P 1/023 257/415 |
| 6,054,761 | A * | 4/2000 | McCormack | H01L 23/49883 174/262 |
| 6,448,177 | B1* | 9/2002 | Morrow | H01L 21/76808 257/E21.579 |

(Continued)

FOREIGN PATENT DOCUMENTS

| | | |
|---|---|---|
| JP | 2005-039158 | 10/2012 |
| KR | 10-2012-0108279 | 10/2001 |

OTHER PUBLICATIONS

Office Action received from Korean Patent Office in Korean; English Translation Not Available; Date: Mar. 18, 2015, 8 pages.

*Primary Examiner* — Xiaoliang Chen
(74) *Attorney, Agent, or Firm* — Kevin B. Jackson

(57) ABSTRACT

In one embodiment, a method for forming an embedded trace substrate includes forming a conductive layer on a carrier. A dielectric film is provided on the conductive layer. Vias are formed in the dielectric film and extend to portions of the conductive layer. A conductive pattern is formed on the dielectric layer and is electrically connected to the conductive layer through the vias. The carrier is removed and portions of the conductive layer are selectively removed to provide a plurality of bumps pads configured to protrude outwardly from the dielectric layer.

9 Claims, 8 Drawing Sheets

(56) References Cited

U.S. PATENT DOCUMENTS

| | | | | |
|---|---|---|---|---|
| 8,772,951 B1* | 7/2014 | Kim | H01L 23/498 257/774 |
| 2008/0179744 A1* | 7/2008 | Yu | H01L 21/6835 257/750 |
| 2008/0290507 A1* | 11/2008 | Park | H05K 1/186 257/717 |
| 2009/0046441 A1* | 2/2009 | Funaya | H01L 21/6835 361/783 |
| 2009/0202949 A1* | 8/2009 | Takemura | H05K 3/108 430/314 |
| 2009/0308647 A1* | 12/2009 | Liao | H05K 3/062 174/257 |
| 2009/0314525 A1* | 12/2009 | Kajino | H05K 1/0265 174/255 |
| 2010/0096171 A1* | 4/2010 | Lee | H05K 3/3484 174/257 |
| 2010/0132985 A1* | 6/2010 | Kang | H05K 1/111 174/257 |
| 2010/0139969 A1* | 6/2010 | An | H05K 3/4007 174/266 |
| 2010/0163293 A1* | 7/2010 | Kawai | H05K 1/113 174/261 |
| 2011/0061922 A1* | 3/2011 | Lee | H01L 23/13 174/261 |
| 2011/0079349 A1* | 4/2011 | Cho | H05K 3/4682 156/247 |
| 2011/0159282 A1* | 6/2011 | Kim | H05K 3/4682 428/344 |
| 2012/0228015 A1* | 9/2012 | Ho | H05K 1/185 174/260 |
| 2013/0220691 A1* | 8/2013 | Suzuki | H05K 3/4602 174/266 |
| 2014/0026412 A1* | 1/2014 | Ishida | H05K 3/4038 29/852 |
| 2014/0036465 A1* | 2/2014 | Hu | H05K 1/181 361/767 |
| 2014/0115889 A1* | 5/2014 | Lin | H05K 3/4682 29/849 |
| 2014/0175672 A1* | 6/2014 | Choi | H01L 24/80 257/777 |
| 2015/0194378 A1* | 7/2015 | Tsang | H01L 23/49838 174/257 |

* cited by examiner

EMBEDDED TRACE SUBSTRATE AND METHOD OF FORMING THE SAME

CROSS-REFERENCE TO RELATED APPLICATIONS

This application claims priority from Korean Patent Application No. 10-2014-0007915 filed on Jan. 22, 2014 in the Korean Intellectual Property Office, and all the benefits accruing therefrom under 35 U.S.C. 119, the contents of which in its entirety are herein incorporated by reference.

BACKGROUND

The present invention relates, in general, to electronics, and more particularly, to semiconductor package substrates, embedded trace substrates, and methods of forming embedded trace substrates having a finer line trace width with relatively higher interfacial bonding strength at a relatively lower cost.

Recently, packaged integrated circuit (IC) structures for mobile applications have become a main driver of the semiconductor industry. Small form factor, thin profile, high performance, multi-function integration and low cost are important requirements for mobile applications and have generated numerous developments in the process, materials, and equipment sectors. Some package solutions have been developed to meet these requirements including embedded trace substrates, which can provide a cost-effective alternative compared with other existing solutions. Compared to traditional core substrates, embedded trace substrates can simplify the substrate fabrication process and enable a finer line width capability in a cost effective manner.

FIGS. 1A through 1E show cross-sectional views of an embedded trace substrate at various stages of fabrication in accordance with the related art.

Referring to FIG. 1A, metal bump patterns 106a, 106b are formed on each of separation films 104a, 104b of a carrier 102. The separation films 104a, 104b are formed on an upper portion and a lower portion of the carrier 102 respectively.

Referring to FIG. 1B, dielectric films 107a and 107b having vias are formed on each of the metal bump patterns 106a, 106b to provide metal patterns connected to each of the metal bump patterns 106a, 106b. Embedded trace substrates 108a, 108b are thus formed on the upper portion and the lower portion of the carrier 102 respectively.

Next, the two embedded trace substrates 108a, 108b including the metal bump patterns 106a, 106b are stripped away from the carrier 102 as shown in FIG. 1C.

Next, as shown in FIG. 1D, a blanket front etching process is used to globally and non-selectively remove portions of the metal bump pattern 106a of the embedded trace substrate 108a. The front etching process is carried out sequentially until the upper portion of the dielectric film 107a is exposed. As shown in FIG. 1E, after the front etching process, bump pads 106 for the embedded pattern are formed. In accordance with the related process, the bump pads 106 are recessed approximately 5-7 micrometers or more below the top surface of the dielectric film 107a due to over-etching, which is difficult to control. The formation of bump pads 106 in this recessed or over-etched manner is one problem with the related embedded trace substrate manufacturing process that can lead to reliability problems. For example, bonding problems between a semiconductor chip and the bond pads 106a can occur because the bonding area is too thin and/or too small. This bonding problem can lead to reliability issues with the bonding interface and can contribute to the deterioration of the mechanical and electrical properties of the packaged device.

Accordingly, it is desired to have an alternative structure and method for providing embedded trace substrates that overcome, among other things, the issues of the related art. Also, it would be beneficial for such a structure and method to be cost effective and compatible with existing manufacturing processes.

Figure 1A:
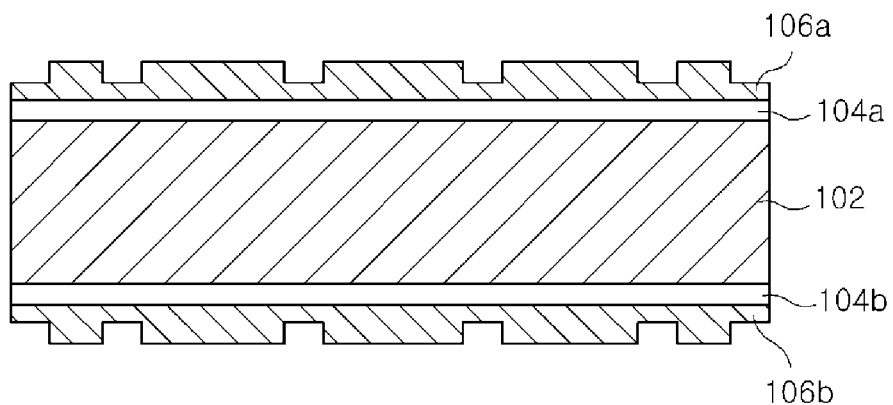
FIGS. 1A through 1E show cross-sectional views of an embedded trace substrate at various stages of fabrication in accordance with the related method.
Figure 1B:
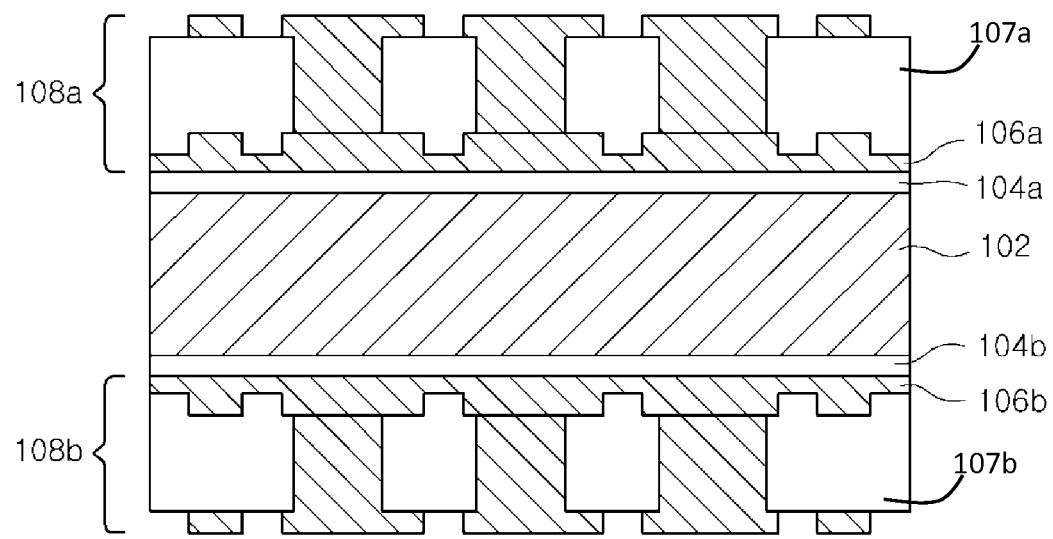
Figure 1C:
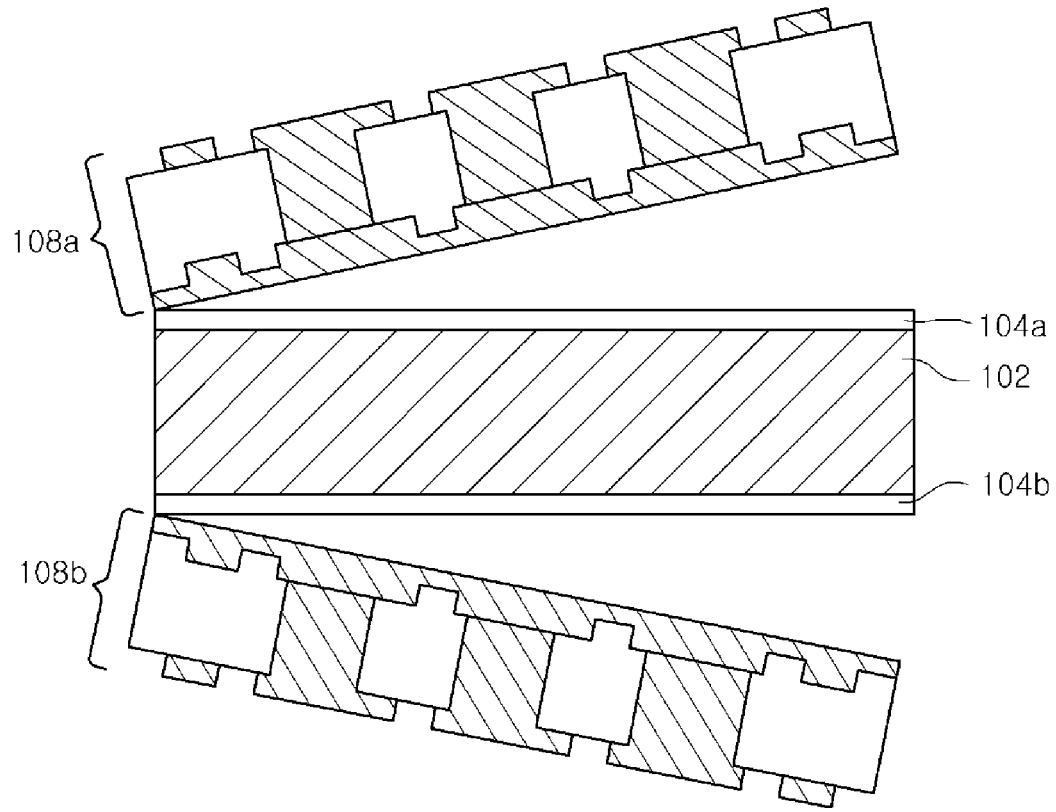
Figure 1D:
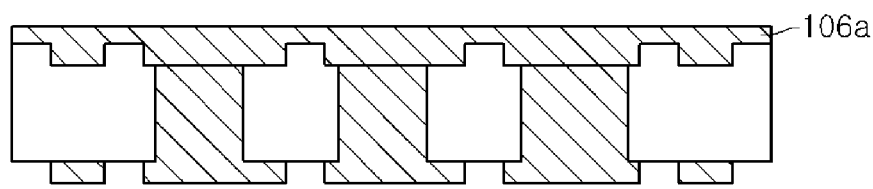
Figure 1E:
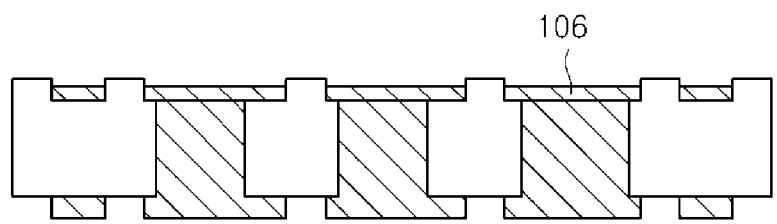

For simplicity and clarity of illustration, elements in the figures are not necessarily drawn to scale, and the same reference numbers in different figures denote generally the same elements. Additionally, descriptions and details of well-known steps and elements are omitted for simplicity of the description. It will be appreciated by those skilled in the art that words, during, while, and when as used herein related to circuit operation are not exact terms that mean an action takes place instantly upon an initiating action but that there may be some small but reasonable delay, such as propagation delay, between the reaction that is initiated by the initial action. Additionally, the term while means a certain action occurs at least within some portion of a duration of the initiating action. The use of word approximately or substantially means a value of an element is expected to be close to a state value or position. However, as is well known in the art there are always minor variances preventing values or positions from being exactly stated. As used herein, the singular forms are intended to include the plural forms as well, unless the context clearly indicates otherwise. It will be understood that, although the terms first, second, etc. may be used herein to describe various members, elements, regions, layers and/or parts, these members, elements, regions, layers and/or parts are not be limited by these terms. These terms are only used to distinguish one member, element, region, layer and/or part from another member, element, region, layer and/or part. Thus, for example, a first member, element, region, layer and/or part discussed below could be termed a second member, element, region, layer and/or part without departing from the teachings of the present invention.

DETAILED DESCRIPTION OF THE DRAWINGS

The present description includes, among other features, an embedded trace substrate having bump pads formed to protrude or extend outward from a dielectric film of the embedded trace substrate by a predetermined height thereby increasing the surface area of the bump pad. Among other things, this enhances the interfacial bonding strength, and also improves the reliability of the embedded trace substrate product.

In one embodiment, an embedded trace substrate includes an embedded trace substrate base composed of a dielectric film having a via and a conductive pattern formed in a shape embedded in the dielectric film. A bump pad having a shape that protrudes outward from (that is, the bump is not recessed) the dielectric film by a predetermined height and being connected to the metal pattern through the via.

In another embodiment, a method of forming an embedded trace substrate includes forming a first conductive layer on a carrier. The method includes providing a dielectric film on the first conductive layer and forming a plurality of vias in the dielectric film extending to the first conductive layer. The method includes forming a conductive pattern on the dielectric film electrically coupled to the first conductive layer. The method includes removing the carrier, and selectively removing portions of the first conductive layer to form a plurality of bump pads, each bump pad protruding outwardly from the dielectric film.

In a further embodiment, a method of forming an embedded trace substrate includes forming a conductive bump pattern on a carrier. The method includes forming a dielectric film having a via on the conductive bump pattern and forming a conductive pattern electrically coupled to the conductive bump pattern through the via. The method includes removing the carrier to provide the embedded trace substrate and selectively removing portions of the conductive bump pattern to provide a plurality of bumps pads, each bump pad having a shape protruding from the dielectric film by a predetermined height.

Hereinafter, the embodiments of the present disclosure will be described with reference to the accompanying drawings.

FIGS. 2A through 2E illustrate cross-sectional views of an embedded trace substrate having an improved bump pad structure at various stages of fabrication in accordance with a first embodiment.

Figure 2A:
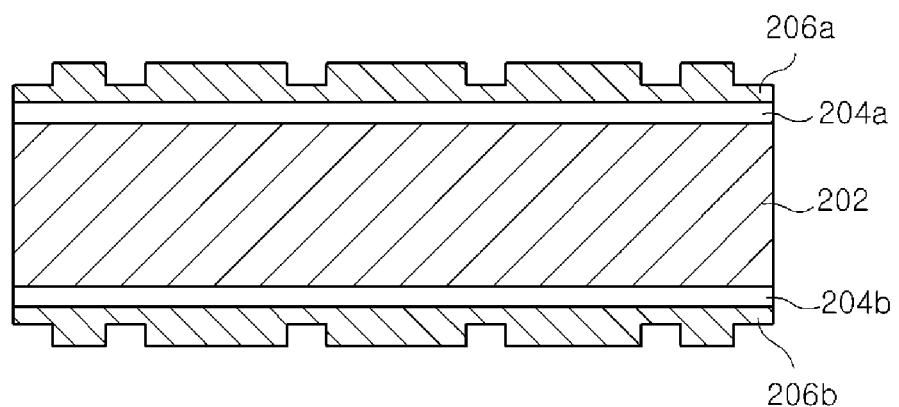
FIGS. 2A through 2E illustrate cross-sectional views of an embedded trace substrate at various stages of fabrication in accordance with an embodiment of the present invention.
Figure 2B:
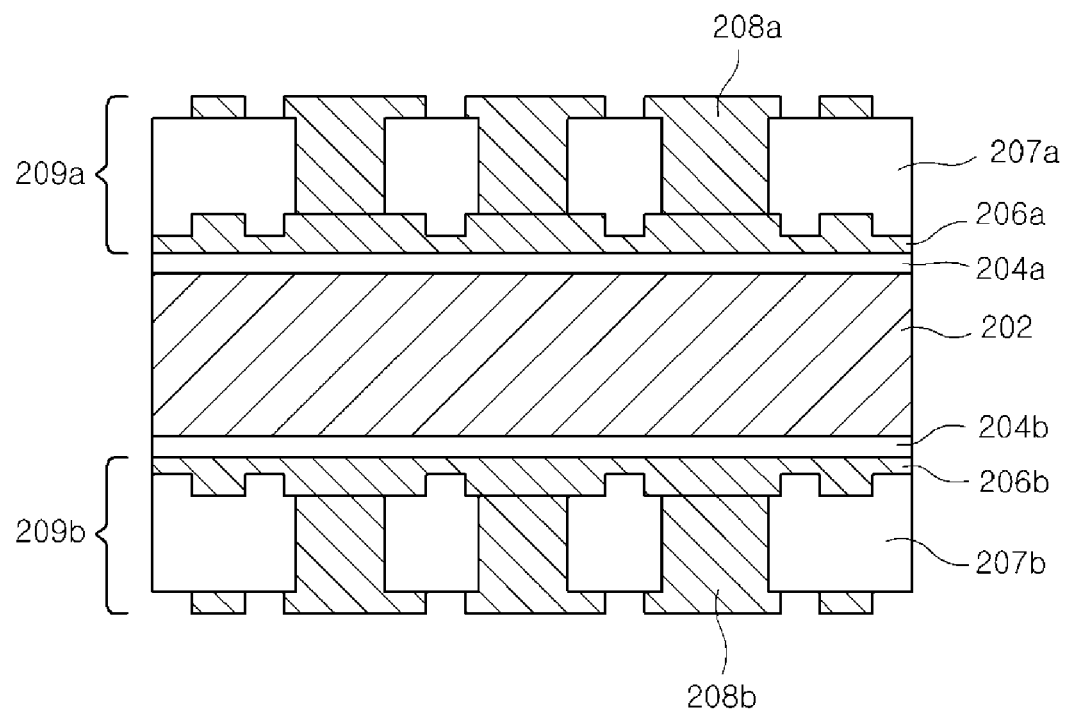

Referring to FIG. 2A, a carrier 202 is provided, and then separation films 204a, 204b are formed on or adjacent to the upper portion and the lower portion of the carrier 202 respectively. After coating or forming a conductive circuit material on each of the separation films 204a, 204b, a patterning process (that is, a process configured to selectively remove the conductive circuit material) can be performed, and through subsequent processes, conductive bump patterns or metal bump patterns 206a, 206b, which will be defined as an area of bump pad (or an area of bump), are formed. In some embodiments, the patterning process can include, for example, a tenting process, a Modified Semi-Additive Process (MSAP), or a Semi-Additive Process (SAP) process. In one embodiment, the carrier 202 can be configured as a dummy plate and can be a material such as a metal, an epoxy resin, a glass or other suitable materials as known to those of ordinary skill in the art.

Next, dielectric films 207a, 207b having vias extending to each of the metal bump patterns 206a, 206b are formed. Conductive patterns or metal patterns 208a, 208b can then be formed and are connected respectively to the metal bump patterns 206a, 206b through the vias. At this stage, as illustrated, for example, in FIG. 2B embedded trace substrates 209a, 209b are formed respectively on or along the upper portion and the lower portion of the carrier 202. In one embodiment, the dielectric films 207a and 207b can be one or more of an epoxy resin, a prepreg, a solder mask, a build-up material, or other suitable insulating materials as known to those of ordinary skill in the art. In one embodiment, the metal patterns 208a, 208b can be a conductive material, such as copper, gold, nickel, titanium a combination of two or more thereof, or other suitable conductive materials as known to those of ordinary skill in the art. In one embodiment, the metal patterns 208a, 208b, which can be formed while embedding the vias, can be formed through a plating method using, for example, a plating-prevention pattern or a similar protective layer.

Figure 2C:
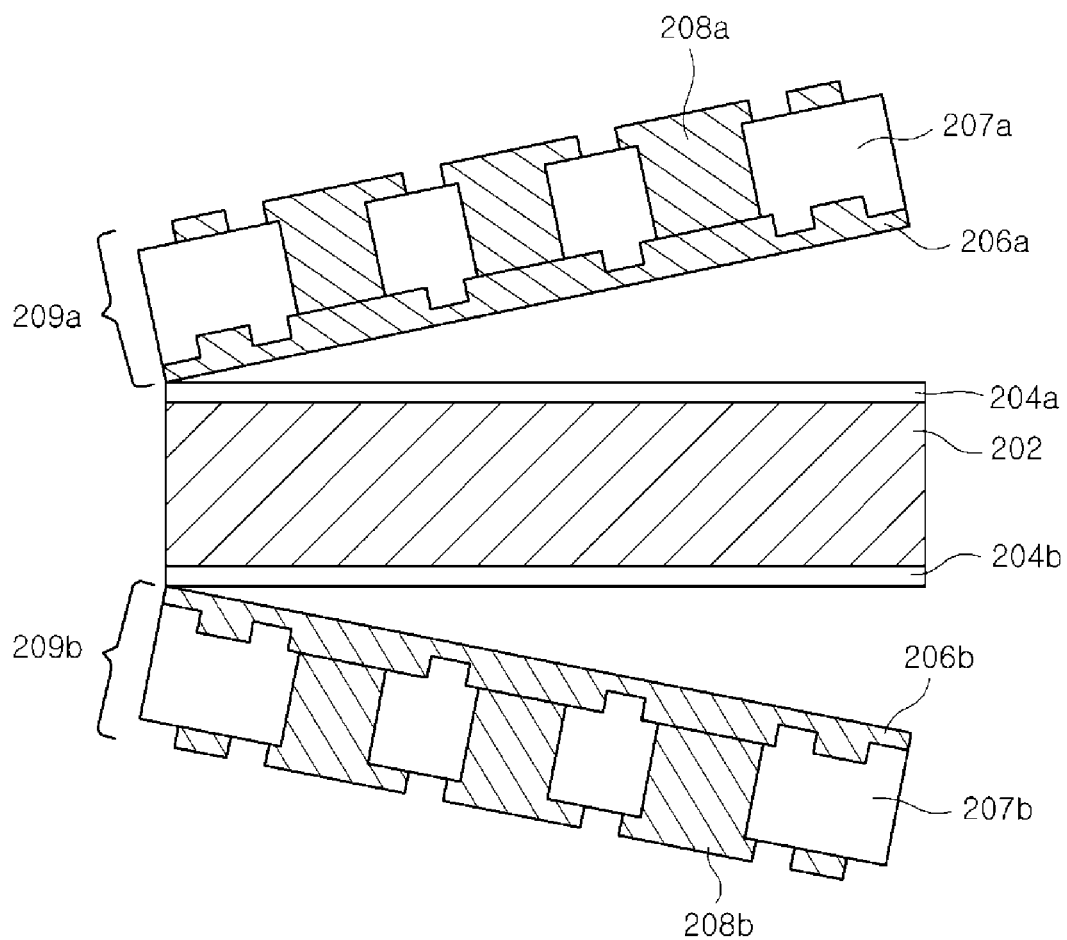

Then, by stripping or removing the two embedded trace substrates 209a, 209b together with each of the metal bump patterns 206a, 206b from the carrier 202, as illustrated in FIG. 2C as an example, a plurality of embedded trace substrates are provided. In one embodiment, the embedded trace substrates 209a and 209b can be configured as embedded trace flip-chip semiconductor substrates.

In accordance with the first embodiment, a process for forming a bump pad (or a pad) on one of the embedded trace substrates manufactured as set forth previously will now be described.

Figure 2D:
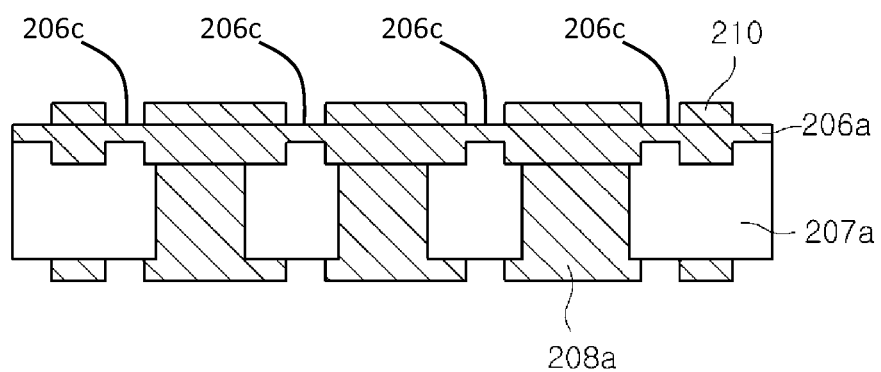
Figure 2E:
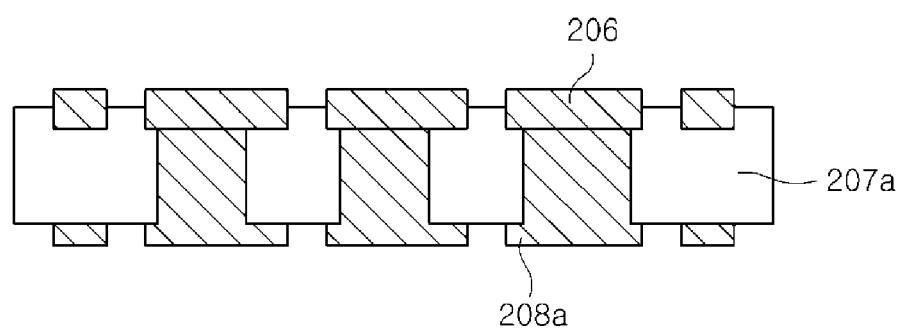

Referring to FIG. 2D, in one embodiment a photo-mask process is used to provide a photosensitive mask 210 having a pattern (that is, a predetermined pattern selectively exposing one or more segments 206c of the upper portion of the metal bump pattern 206a) defining an area of the bump pad (or pad area) to be formed on the metal bump pattern 206a. In one embodiment, the photosensitive mask 210 may be a Dry Film Resist (DFR) or other similar materials as known to those of ordinary skill in the art.

Next, a removal process, such as an etching process, can be performed using the photosensitive mask as an etching barrier layer or a protective layer. In one embodiment, the metal bump pattern 206a having the exposed segments 206c is etched inward to expose segments of the upper portion of the dielectric film 207a outside of the area of bump pad to be exposed, and the remaining photosensitive mask 210 is removed using, for example, a stripping process. Consequently, as illustrated, for example, in FIG. 2E the bump pad 206 having a shape that protrudes above or outwardly from the dielectric film 207a by a predetermined height is formed.

In this embodiment, each of the bump pads 206 can be defined, for example, as a bump having a shape protruding outward from the dielectric film 207a by a predetermined thickness beyond the height or thickness of the dielectric film 207a. In some embodiments, the bump pads 206 can extend about 1 micrometer to about 10 micrometers beyond the dielectric film 207a. The bump pad 206 can be manufactured in various shapes, for example, any one of a circular shape, an oval shape, a triangle shape or a rectangular shape, depending on the shape of the patterned openings of the photosensitive mask 210. In one or more subsequent steps, the remaining structure other than the bump pad 206 can be defined, for example, as an embedded trace substrate base.

Those skilled in the art will appreciate that in accordance with the present embodiment, an embedded trace substrate can include a dielectric film having plurality of vias, an embedded trace substrate base including a conductive pattern, such as a metal pattern, formed as a pattern (formed as an embedded type) within the dielectric film, and a bump pattern formed in a shape protruding outwardly from the dielectric film by a predetermined height and connected to the metal pattern through one or more of the vias.

In accordance with the present embodiment, the bump pad (or bump structure) provides, among other things, a bonding area (for example, the bump area for bonding with a bump of a semiconductor chip) relatively larger through the shape protruding outward from the dielectric film by a predetermined height, thereby being configured to improve or enhance the interfacial bonding strength at the bump pad.

Those skilled in the art will also appreciate that although the present embodiment has been described with bump pads formed on an embedded trace substrate with a single layer structure, the disclosure is not necessarily limited to single layer substrates and can be applied to other structures including, for example, an embedded trace substrate with a multi-layer structure.

Further, in the present embodiment, the protruding height of the bump pad is provided in a range of about 1 micrometer to about 10 micrometers by way of example. However, in other embodiments the range of the height can vary in a relatively lower range or higher range as well, depending on selected technologies or process conditions to be applied.

FIGS. 3A through 3E illustrate cross-sectional views of an embedded trace substrate having an improved bump structure in accordance with another embodiment at various stages of fabrication.

The present embodiment can use similar manufacturing steps as those used for forming two embedded trace substrates as described previously in conjunction with FIGS. 2A through 2C, and those steps will not be repeated here.

Figure 3A:
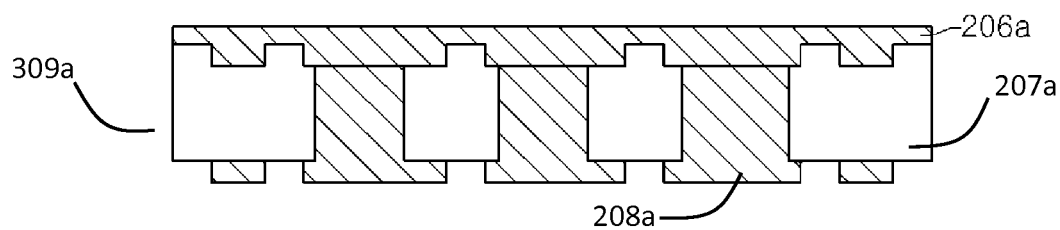
FIGS. 3A through 3E illustrate cross-sectional views of an embedded trace substrate at various stages of fabrication in accordance with another embodiment of the present invention.

Referring to FIG. 3A, by sequentially carrying out similar processes as the first embodiment as described previously, an embedded trace substrate 309a having the conductive bump pattern or metal bump pattern 206a to be defined as the bump area is provided.

Figure 3B:
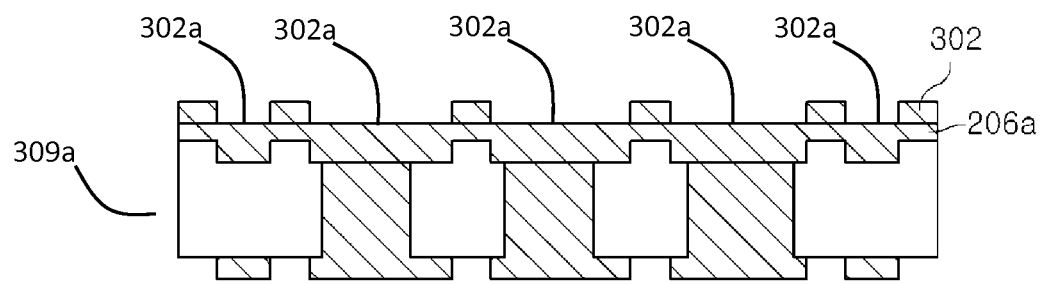

Next, by carrying out a photo-mask process, as illustrated, for example, in FIG. 3B a photosensitive mask 302 having a pattern that exposes an area 302a of the bump pad (or a bump area) on the metal bump pattern 206a is formed. In some embodiments, a DFR film or a similar material can be used for the photosensitive mask 302.

Figure 3C:
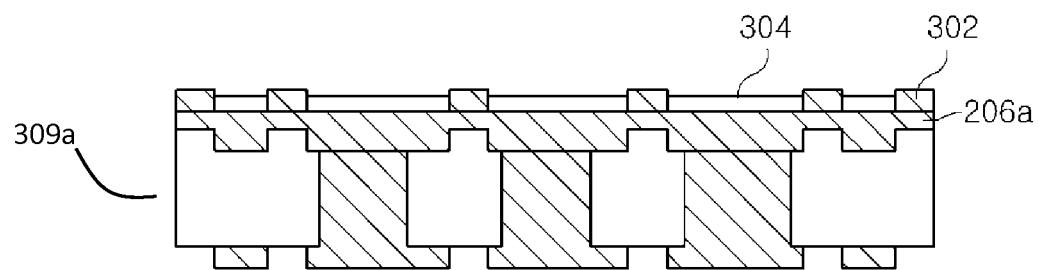
Figure 3D:
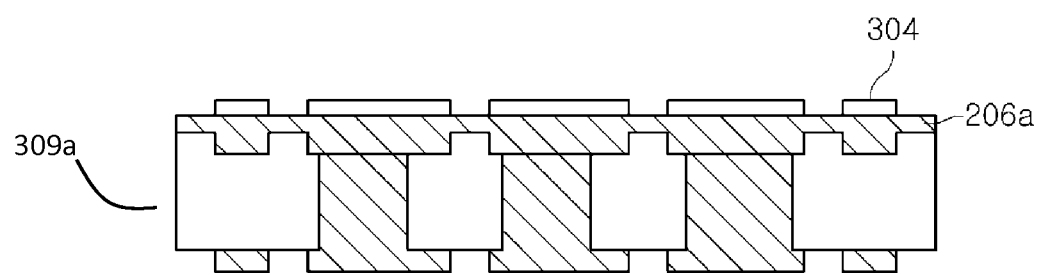

FIG. 3C illustrates the embedded trace substrate 309a after additional processing. In one embodiment, a sacrificial film 304 is formed having a predetermined thickness on the exposed area 302a of the metal bump pattern 206a. The mask 302 can then be removed as illustrated, for example, in FIG. 3D. In some embodiments, the sacrificial film 304 can be a conductive material formed using plating techniques or other deposition techniques. In some embodiments, sacrificial film 304 can be the same material as metal bump pattern 206a. In other embodiments, sacrificial film 304 can be a different material than metal bump pattern 206a.

Figure 3E:
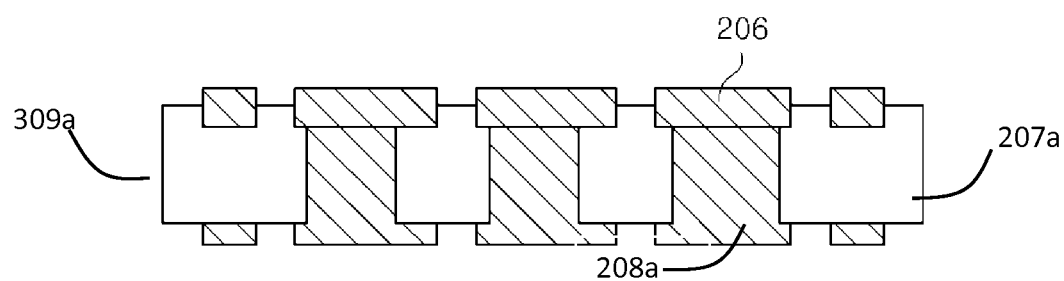

FIG. 3E illustrates the embedded trace substrate 309a after further processing. In accordance with the present embodiment, the sacrificial film 304 and the exposed portions of the metal bump pattern 206a are removed. In one embodiment, a front etching or a blanket etching process is used to remove material (including in some embodiments portions of the sacrificial film 304) until the upper portion of the dielectric film 207a is exposed where the sacrificial film 304 was not formed to provide the bump pads 206 configured to protrude outwardly from the dielectric film 207a by a predetermined height.

In accordance with the present embodiment, the bump pads 206 are configured as bumps each having a shape protruding outward from the dielectric film 207a by a predetermined height (for example, in some embodiments a relatively higher protruding height (for example, greater than 10 micrometers) compared to the protruding height of the first embodiment), and can be manufactured in various shapes, for example, one or more of a circular shape, an oval shape, a triangle shape or a rectangular shape depending on the patterned openings of the photosensitive mask 302. In some embodiments, it can be an advantage that the protruding height of the bump pads 206 is relatively higher than the protruding height of the bump pad of the first embodiment, because the bump of the present embodiment is formed by the pattern plating method. In one or more subsequent steps, the remaining structure other than the bump pad 206 may be defined, for example, as an embedded trace substrate base.

Those skilled in the art will appreciate that in accordance with the present embodiment, an embedded trace substrate can include a dielectric film having a plurality of vias, an embedded trace substrate base including a conductive pattern, such as a metal pattern, formed as a pattern (formed as an embedded type) within the dielectric film, and a bump pattern formed in a shape protruding outward from the dielectric film by a predetermined height and is connected to the metal pattern through one or more of the vias.

Therefore, the bump pad (or bump) manufactured in accordance with the present embodiment is configured to provide, among other things, a bonding area (for example, a bonding area with a bump of a semiconductor chip) relatively larger through the shape protruding outward from the dielectric film by a predetermined height, thereby being configured to increase the interfacial bonding strength at the bump pad.

In other embodiments, the thickness of the sacrificial film 304 can be increased as desired so that after front etching, a portion of the sacrificial film 304 can remain on the bump pads 206. In accordance with the present embodiment, the protruding height of the bump pad can be increased and still support a fine pitch (for example, less than 100 micrometers) of the bump pads 206.

Those skilled in the art will also appreciate that although the present embodiment has been described with bump pads formed on an embedded trace substrate with a single layer structure, the disclosure is not necessarily limited to single layer substrates and can be applied to other structures including, for example, an embedded trace substrate with a multi-layer structure.

In view of all of the above, it is evident that a novel method and structure are disclosed. Including among other features, is an embedded trace substrate having a bump pad structure that protrudes outwardly or extends above a dielectric film. The bump pad configuration provides, among other things, an improved bonding interface with other components, such as semiconductor chips, which are attached to the bump pads. This further improves the integrity and reliability of the assembly compared to related structures that have recessed bump pads.

While the subject matter of the invention is described with specific preferred embodiments and example embodiments, the foregoing drawings and descriptions thereof depict only typical embodiments of the subject matter and are not therefore to be considered limiting of its scope. It is evident that many alternatives and variations will be apparent to those skilled in the art.

As the claims hereinafter reflect, inventive aspects may lie in less than all features of a single foregoing disclosed embodiment. Thus, the hereinafter expressed claims are hereby expressly incorporated into this Detailed Description of the Drawings, with each claim standing on its own as a separate embodiment of the invention. Furthermore, while some embodiments described herein include some but not other features included in other embodiments, combinations of features of different embodiments are meant to be within the scope of the invention and meant to form different embodiments, as would be understood by those skilled in the art.

What is claimed is:
1. A method of forming an embedded trace substrate comprising:
    forming a first conductive layer on a carrier;

patterning the first conductive layer to provide a conductive bump pattern having first portions defining a plurality of bump pads and second portions extending laterally between each bump pad, wherein the second portions have a thickness that is thinner than the first portions;

thereafter forming a dielectric film adjacent the conductive bump pattern;

forming a plurality of vias in the dielectric film extending to the conductive bump pattern;

forming a conductive pattern on the dielectric film electrically coupled to the conductive bump pattern through the vias, wherein conductive pattern protrudes outwardly from the dielectric film, and wherein portions of the dielectric film are exposed in the conductive pattern;

thereafter removing the carrier; and thereafter selectively removing the second portions of the conductive bump pattern to form the plurality of bump pads, each bump pad protruding outwardly from the dielectric film by a predetermined height, and wherein a portion of each bump pad remains embedded within the dielectric film to provide the embedded trace substrate.

2. The method of claim 1, wherein selectively removing comprises:

forming a masking layer on the conductive bump pattern, the masking layer having a predetermined pattern covering the first portions while leaving the second portions exposed; and removing the second portions to expose segments of the dielectric layer.

3. The method of claim 2 further comprising removing the masking layer after removing the second portions.

4. The method of claim 2 further comprising;

forming a sacrificial film on the first portions; and removing the masking layer before removing the second portions, wherein removing the second portions comprises:

in a single step, removing the second portions and removing at least a portion of the sacrificial film to form the plurality of bump pads.

5. The method of claim 2, wherein forming the masking layer comprises forming a photosensitive mask.

6. The method of claim 5, wherein:

forming the first conductive layer comprises forming the first conductive layer on a carrier comprising one or more of a metal, an epoxy resin, or glass;

forming the dielectric film comprises forming a film comprising one or more of an epoxy resin, a prepeg, a solder mask, or a buildup material;

forming the photosensitive mask comprises forming a dry film photoresist mask;

forming the conductive pattern comprises forming the conductive pattern comprising one or more of copper, gold, nickel, or titanium; and selectively removing the second portions to form the plurality of bump pads comprises forming the plurality of bump pads having any one of a circular shape, an oval shape, a triangle shape or a rectangular shape.

7. The method of claim 1, wherein selectively removing the second portions to form the plurality of bump pads comprises forming the plurality of bump pads configured to have a height in range of 1 micrometer to about 10 micrometers beyond the dielectric film.

8. The method of claim 1, wherein forming the conductive pattern comprises forming the conductive pattern comprising one or more of copper, gold, nickel, or titanium.

9. The method of claim 1, wherein selectively removing comprises selectively removing, wherein the predetermined height is greater than or equal to the thickness of the second portions.

* * * * *